United States Patent
Atwal et al.

(10) Patent No.: US 9,476,119 B2
(45) Date of Patent: Oct. 25, 2016

(54) METHOD AND AN ARRANGEMENT FOR VAPOUR PHASE COATING OF AN INTERNAL SURFACE OF AT LEAST ONE HOLLOW ARTICLE

(75) Inventors: Baljit S Atwal, Leicester (GB); Andrew Hewitt, Derby (GB)

(73) Assignee: ROLLS-ROYCE plc, London (GB)

( * ) Notice: Subject to any disclaimer, the term of this patent is extended or adjusted under 35 U.S.C. 154(b) by 1127 days.

(21) Appl. No.: 13/148,077

(22) PCT Filed: Jan. 19, 2010

(86) PCT No.: PCT/EP2010/000268
§ 371 (c)(1),
(2), (4) Date: Aug. 5, 2011

(87) PCT Pub. No.: WO2010/094376
PCT Pub. Date: Aug. 26, 2010

(65) Prior Publication Data
US 2011/0293825 A1    Dec. 1, 2011

(30) Foreign Application Priority Data

Feb. 18, 2009  (GB) .................................. 0902633.7

(51) Int. Cl.
*C23C 16/44* (2006.01)
*C23C 10/06* (2006.01)
(Continued)

(52) U.S. Cl.
CPC ........... *C23C 16/4409* (2013.01); *C23C 10/06* (2013.01); *C23C 10/10* (2013.01); *C23C 16/045* (2013.01); *C23C 16/458* (2013.01); *F01D 5/18* (2013.01); *F05D 2230/90* (2013.01)

(58) Field of Classification Search
CPC ..... C23C 10/06; C23C 10/10; C23C 16/045; C23C 16/046; C23C 16/409; C23C 16/458; F01D 5/18; F01D 2230/90

USPC .................................. 118/715, 733; 427/237
See application file for complete search history.

(56) References Cited

U.S. PATENT DOCUMENTS 4,965,095 A     10/1990  Baldi
5,071,678 A  *  12/1991  Grybowski ............. C23C 10/08
                                                                427/253

(Continued)

FOREIGN PATENT DOCUMENTS

EP           1 143 032 A1     10/2001

OTHER PUBLICATIONS

Search Report issued in British Patent Application No. 0902633.7 dated Sep. 16, 2009.

(Continued)

*Primary Examiner* — Jeffrie R Lund
(74) *Attorney, Agent, or Firm* — Oliff PLC

(57) ABSTRACT

An arrangement for vapor phase coating an internal surface of hollow articles comprises a part plate, at least one spud site and at least one manifold. The part plate defines a portion of a chamber for supplying a vapor coating. Each spud site has a tube and a first moldable sealant is arranged around the tube. Each manifold has at least one supply tube extending from the manifold to supply vapor into a respective hollow article. Each manifold has a feed tube extending from the manifold to supply vapor into the manifold. The tube of each spud site is inserted into the feed tube of the respective manifold and an end of the feed tube remote from the manifold locates in the first moldable sealant. A second moldable sealant is arranged around the at least one supply tube of the respective manifold and between the respective manifold and hollow article.

19 Claims, 2 Drawing Sheets

(51) Int. Cl.
*C23C 10/10* (2006.01)
*C23C 16/04* (2006.01)
*C23C 16/458* (2006.01)
*F01D 5/18* (2006.01)

(56) References Cited

U.S. PATENT DOCUMENTS

| | | | | |
|---|---|---|---|---|
| 5,221,354 A * | 6/1993 | Rigney | C23C 10/06 | |
| | | | 118/715 | |
| 5,308,399 A * | 5/1994 | Pillhoefer | C23C 10/08 | |
| | | | 118/715 | |
| 5,368,888 A * | 11/1994 | Rigney | C23C 10/06 | |
| | | | 118/500 | |
| 5,928,725 A | 7/1999 | Howard et al. | | |
| 6,039,810 A | 3/2000 | Mantkowski et al. | | |
| 6,180,170 B1 * | 1/2001 | Grossmann et al. | 427/237 | |
| 6,224,941 B1 * | 5/2001 | Chen | C23C 10/48 | |
| | | | 427/252 | |
| 6,273,678 B1 * | 8/2001 | Darolia | F01D 5/18 | |
| | | | 29/889.7 | |
| 6,332,926 B1 * | 12/2001 | Pfaendtner | C23C 16/042 | |
| | | | 118/504 | |
| 6,589,668 B1 | 7/2003 | Braithwaite et al. | | |
| 7,875,119 B2 * | 1/2011 | Gartland | C23C 14/046 | |
| | | | 118/715 | |
| 2002/0098284 A1 * | 7/2002 | Wheat et al. | 427/248.1 | |
| 2003/0116278 A1 * | 6/2003 | Wheat | C23C 10/06 | |
| | | | 156/345.33 | |
| 2004/0005409 A1 | 1/2004 | Das et al. | | |
| 2004/0096375 A1 * | 5/2004 | Cesa | 422/186.04 | |
| 2005/0008780 A1 * | 1/2005 | Ackerman | C23C 10/08 | |
| | | | 427/252 | |
| 2006/0141283 A1 * | 6/2006 | Madhava | C23C 10/58 | |
| | | | 428/651 | |
| 2007/0274831 A1 | 11/2007 | Beck et al. | | |
| 2008/0057193 A1 * | 3/2008 | Mantkowski | C23C 10/04 | |
| | | | 427/237 | |
| 2011/0293825 A1 * | 12/2011 | Atwal et al. | 427/237 | |

OTHER PUBLICATIONS

International Search Report issued in International Patent Application No. PCT/EP2010/000268 dated May 31, 2011.
Written Opinion issued in International Patent Application No. PCT/EP2010/000268 dated May 31, 2011.
APV Engineered Coatings, APV Maskants Brochure, date unknown, pp. 1-6.

* cited by examiner

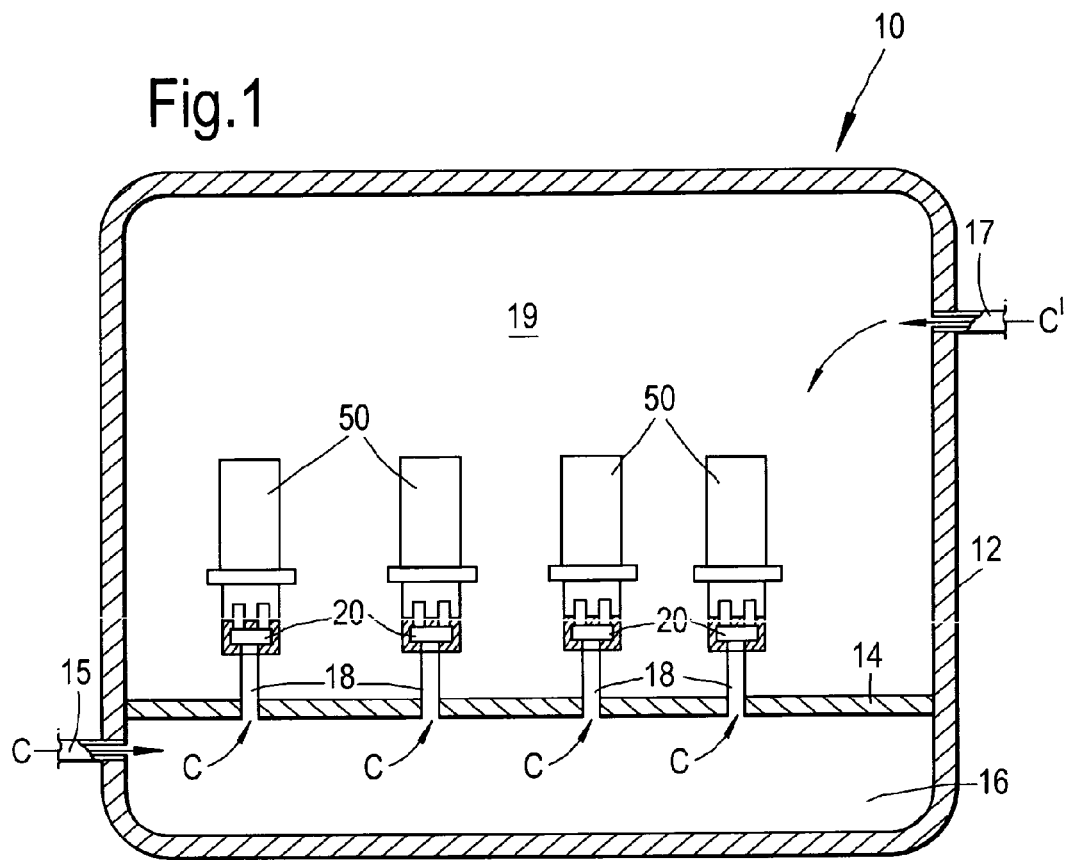
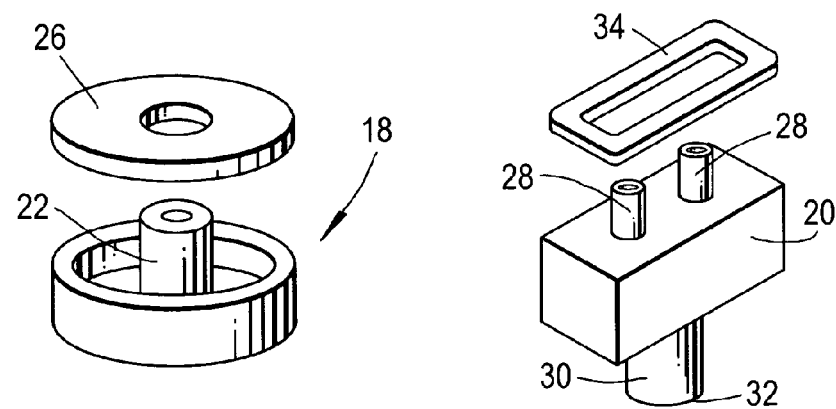

METHOD AND AN ARRANGEMENT FOR VAPOUR PHASE COATING OF AN INTERNAL SURFACE OF AT LEAST ONE HOLLOW ARTICLE

The present invention relates to a method and an arrangement for vapour phase coating an internal surface of hollow articles and in particular to vapour phase aluminising or vapour phase chromising of internal surfaces of hollow gas turbine engine components, e.g. hollow turbine blades or hollow turbine vanes.

Vapour phase aluminising and vapour phase chromising are well known processes for the deposition of aluminium coatings and chromium coatings respectively onto external and/or internal surfaces of articles, e.g. hollow gas turbine engine components.

The apparatus for vapour phase coating of internal surfaces of hollow articles comprises a manifold and one or more supply tubes extend from the manifold to supply vapour into a hollow article. A refractory putty is provided between the manifold and the article to hold them together and to form a seal. In addition it is known to provide a wire, or a spring clip, to hold the manifold and the article together. The manifold has a feed tube and the feed tube extends from the manifold into a spud site on a part plate, the spud site comprises a hollow tube and the feed tube locates in the hollow tube. The end of the feed tube remote from the manifold is tapered to allow insertion into the spud site. A refractory slurry is applied by brush around the interface between the feed tube and the spud site to form a seal. The part plate defines a portion of a chamber to supply vapour to the manifold.

A problem with this arrangement is that the refractory putty between the manifold and the hollow article does not hold the hollow article onto the manifold in a reliable manner because the refractory putty does not have sufficient adhesion and the manifold and the hollow article frequently separate. In addition the refractory putty is susceptible to shrinking and cracking which allows leakage of the supply vapour and inconsistent coating of the internal surfaces of the hollow article. Furthermore, the use of wire or spring clips may damage the external surface of the hollow article. The refractory slurry used to form the seal between the spud site and the feed tube is very brittle and any movement of the assembly results in cracking of the seal and leakage of the supply vapour and inconsistent coating of the internal surfaces of the hollow article. The tapered end of the feed tube is prone to embrittlement due to the supply vapour and the tapered end of the feed tube often remains jammed in the spud site or is snapped off the feed tube.

Accordingly the present invention seeks to provide a novel arrangement for vapour phase coating of at least one hollow article which reduces, preferably overcomes, the above mentioned problem.

Accordingly the present invention provides an arrangement for vapour phase coating an internal surface of at least one hollow article comprising a part plate, at least one spud site and at least one manifold, the part plate defining a portion of a chamber for supplying a vapour coating, each spud site having a tube, a first mouldable sealant being arranged around the tube, each manifold having at least one supply tube extending from the manifold to supply vapour into a respective hollow article, each manifold having a feed tube extending from the manifold to supply vapour into the manifold, the tube of each spud site being inserted into the feed tube of a respective manifold, an end of the feed tube remote from the manifold locating in the first mouldable sealant around the tube of the respective spud site and a second mouldable sealant being arranged around the at least one supply tube of the respective manifold and between the respective manifold and hollow article.

Preferably a respective member extends from and is arranged around the tube of each spud site to form a recess around each tube, each recess containing the first mouldable sealant and the end of the feed tube remote from the manifold locating in the first mouldable sealant around the tube of the respective spud site.

Preferably the first mouldable sealant and or the second mouldable sealant is a mouldable putty.

Preferably the mouldable putty is a masking putty and comprises base metal powder which acts as a getter of vapour coating, for example a getter for aluminium vapour coating or chromium vapour coating.

Preferably the base metal power comprises nickel powder and/or cobalt powder.

Preferably the member extending from the tube of the spud site is L-shape in cross-section.

Preferably the tube of the spud site is circular in cross-section. Preferably the member extending from the tube of the spud site is arranged coaxially with the tube and the recess is annular.

Preferably the feed tube of the manifold is circular in cross-section.

The present invention also provides a method of vapour phase coating an internal surface of at least one hollow article comprising providing a part plate, at least one spud site and at least one manifold, the part plate defining a portion of a chamber, each spud site having a tube, a first mouldable sealant being arranged around the tube, each manifold having at least one supply tube extending from the manifold, each supply tube extending into a respective hollow article, each manifold having a feed tube extending from the manifold, the tube of each spud site being inserted into the feed tube of a respective manifold, an end of the feed tube remote from the manifold locating in the first mouldable sealant around the tube of the respective spud site and a second mouldable sealant being arranged around the at least one supply tube of the respective manifold and between the respective manifold and hollow article, the method comprising supplying a vapour coating into the chamber and supplying vapour coating from the chamber through the tube of the each spud site and through the feed tube into the respective manifold, supplying vapour coating from each manifold through the supply tube into the respective hollow article to coat the internal surfaces of each hollow article.

Preferably a respective member extends from and is arranged around the tube of each spud site to form a recess around each tube, each recess containing the first mouldable sealant and the end of the feed tube remote from the manifold locating in the first mouldable sealant around the tube of the respective spud site.

Preferably the first mouldable sealant and or the second mouldable sealant is a mouldable putty.

Preferably the mouldable putty is a masking putty and comprises base metal powder which acts as a getter of vapour coating, for example a getter for aluminium vapour coating or chromium vapour coating.

Preferably the base metal power comprises nickel powder and/or cobalt powder.

Preferably the member extending from the tube of the spud site is L-shape in cross-section.

Preferably the tube of the spud site is circular in cross-section.

Preferably the member extending from the tube of the spud site is arranged coaxially with the tube and the recess is annular.

Preferably the feed tube of the manifold is circular in cross-section.

Preferably the hollow article is a turbine blade or a turbine vane. The turbine blade or turbine vane may be a component of a gas turbine engine. The hollow article may be any other component of a gas turbine engine.

Preferably the vapour phase coating comprises chromising or aluminising.

The present invention will be more fully described by way of example with reference to the accompanying drawings in which:

FIG. 1 shows an arrangement for vapour phase coating an internal surface of a hollow article according to the present invention.

FIG. 3 is an exploded view of the part of the arrangement for vapour phase coating an in internal surface of a hollow article shown in FIG. 2.

Figure 2:
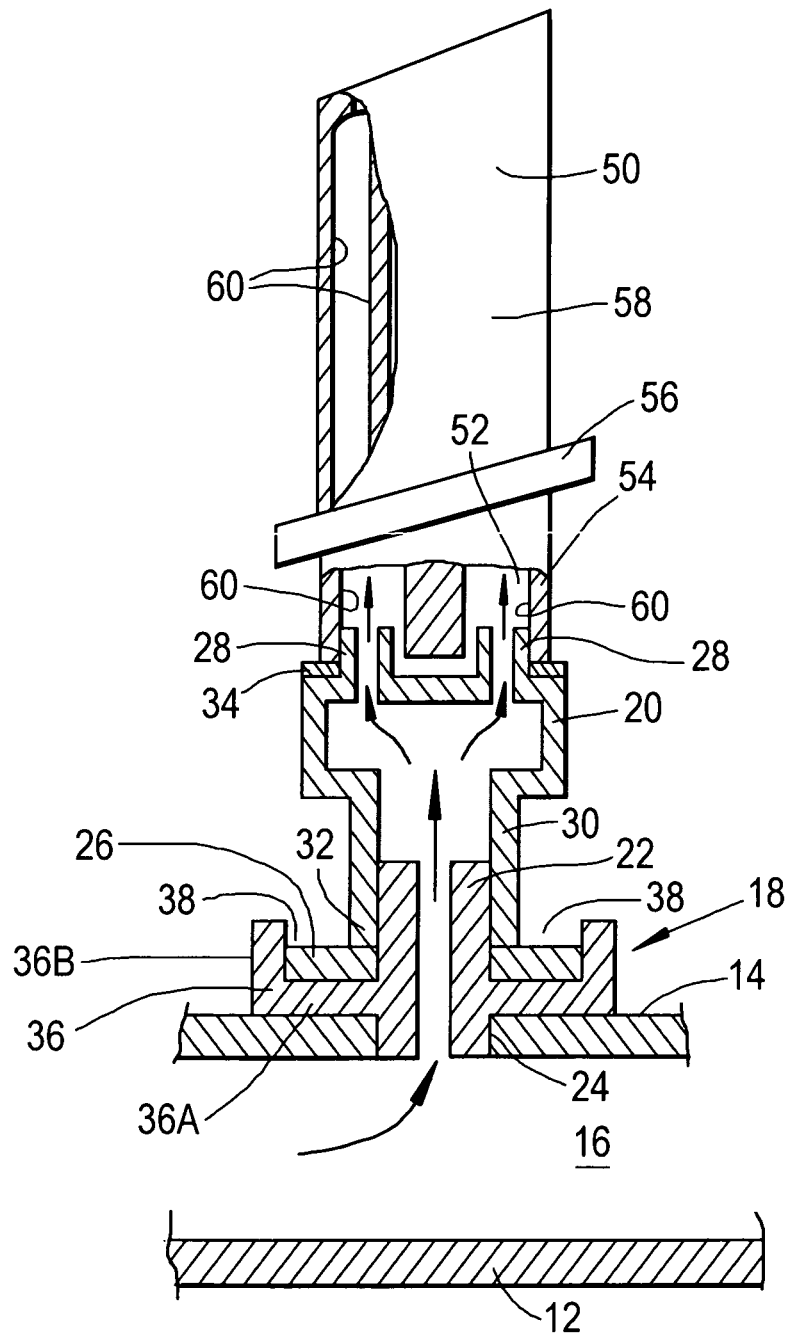
FIG. 2 is a cross-sectional view to an increased scale of part of the arrangement for vapour phase coating an internal surface of a hollow article shown in FIG. 1.

An arrangement 10 for vapour phase coating an internal surface of at least one hollow article 50, preferably a plurality of hollow articles 50, is shown in FIGS. 1 to 3. The arrangement 10 for vapour phase coating an internal surface of at least one hollow article 50 comprises, as shown in FIG. 1, a retort 12 and a part plate 14 is arranged within the retort 12. The part plate 14 defines a portion of a chamber 16 and in this arrangement the chamber 16 is defined between a portion of the retort 12 and the part plate 14 and thus the retort 12 defines a portion of the chamber 16. A pipe 15 is arranged to supply a vapour phase coating C into the chamber 16. The part plate 14 has at least one spud site 18 and at least one manifold 20 is associated with the at least one spud site 18. The at least one spud site 18 is arranged to supply vapour coating C from the chamber 16 to the associated manifold 20 and the manifold 20 is arranged to supply the vapour phase coating C to the internal surface of the hollow article 50. It is desirable to coat the internal surfaces of a plurality of hollow articles 50 at any one time and so the part plate 14 is generally provided with a plurality of spud sites 18 and each spud site 18 has a respective manifold 20 to supply vapour phase coating C to a respective hollow article 50.

The vapour phase coating arrangement 10 is shown more clearly in FIGS. 2 and 3 and each spud site 18 comprises a tube 22 which locates in an aperture 24 in the part plate 14 and a first mouldable sealant 26 is arranged around the tube 22. Each manifold 20 has at least one supply tube 28 extending from the manifold 20 to supply vapour phase coating C into a respective hollow article 50. Each manifold 20 has a feed tube 30 extending from the manifold to supply vapour phase coating C into the manifold C. The tube 22 of each spud site 18 is inserted into the feed tube 30 of the respective manifold 20 or the feed tube 30 of each manifold 20 is slid over the tube 22 of the respective spud site 18. An end 32 of the feed tube 30 remote from the manifold 20 locates in the first mouldable sealant 26 around the tube 22 of the respective spud site 18. A second mouldable sealant 34 is arranged around the supply tube, or supply tubes, 28 of the respective manifold 20 and between the respective manifold 20 and hollow article 50.

A member 36 extends from and is arranged around the tube 22 of each spud site 18 to form a recess 38 around the tube 22. Each recess 38 contains the first moldable sealant 26 and the end 32 of the feed tube 30 remote from the manifold 20 locates in the first moldable sealant 26 around the tube 22 of the respective spud site 18. The member 36 extending from the tube 22 of the spud site 18 is L-shape in cross-section, but other suitable shapes may be used, or the member 36 may simply extend linearly from the tube 22 and the mouldable sealant 26 is arranged on the member 36 and around the tube 22. In some instances it may be possible to dispense with the member 36 and simply provide the mouldable sealant 26 on the part plate 14 and around the tube 22.

The first mouldable sealant 26 and the second mouldable sealant 34 is a mouldable putty and the mouldable putty is a masking putty and comprises base metal powder which acts as a getter of vapour phase coating C, for example a getter for aluminium vapour coating or chromium vapour coating. The base metal power comprises for example nickel powder and/or cobalt powder.

The tube 22 of the spud site 18 is preferably circular in cross-section and preferably the member 36 extending from the tube 22 of the spud site 18 is arranged coaxially with the tube 22 and the recess 38 is annular. The L-section member 36 has a radially extending portion 36A and an axially extending portion 36B. The feed tube 30 of the manifold 20 is circular in cross-section in order to locate over the tube 22 of the respective spud site 18. The tubes 28 are any suitable shape to locate in the hollow article 50.

In operation vapour phase coating C, for example chromium vapour or aluminium vapour, is supplied into the chamber 16 via pipe 15 and the vapour phase coating C flows from the chamber 16 through the tubes 22 of each spud site and the feed tubes 30 of the respective manifolds 20 into the respective manifolds 20. The vapour phase coating C then flows from each manifold 20 via the supply tubes 28 into the respective hollow articles 50 to coat the internal surfaces 60 of the hollow articles 50.

A shown in FIGS. 1 and 2 the hollow articles 50 are gas turbine engine turbine blades. The turbine blades comprise a root portion 52, a shank portion 54, a platform portion 56 and an aerofoil portion 58. The vapour phase coating C coats the internal surfaces 60 within the root portion 52, a shank portion 54, a platform portion 56 and an aerofoil portion 58 of each turbine blade 50. The arrangement 10 may be arranged to coat the internal surfaces of hollow gas turbine engine turbine vanes or other gas turbine engine components.

It may be possible to supply a vapour phase coating C' through a pipe 17 into a further chamber 19 within the retort 12 to coat the external surfaces of the hollow articles, turbine blades, 50. The vapour phase coating C' may be the same or a different vapour phase coating to the vapour phase coating C. It may be possible to provide different vapour phase coatings on different regions of the external surfaces of the hollow articles, turbine blades, 50. The vapour phase coating may be aluminising or chromising or platinum aluminising.

The advantage of the present invention is that the arrangement of the mouldable sealant provides a stronger gas tight seal between the hollow article and the manifold than the prior arrangement and requires no further mechanical arrangement of securing the hollow article onto the manifold. The mouldable sealant also provides a good gas tight seal between the manifold and the spud site or the part plate. The mouldable sealant reduces, minimises, vapour phase coating leakage and therefore the vapour phase coating of the internal surfaces of complex internal passages, multi-pass internal passages, within gas turbine engine turbine blades and/or turbine vanes is possible without excessive vapour feed pressures which are normally required to take account of the large losses due to leakage. The present invention dispenses with wire locking and thus minimises damage to the hollow articles. The present invention provides an increased yield. The manifolds are no longer jammed onto the part plates and are less prone to embrittlement due to being a larger section tube fitting over the spud site. The present invention may also be used to supply an inert gas, or a non-reactive gas, at higher pressure into the hollow articles to prevent a coating vapour supplied into the retort to coat the external surfaces of the hollow article from coating the internal surfaces of the hollow article if so desired.

The invention claimed is:

1. An arrangement for vapor phase coating an internal surface of at least one hollow article comprising: a retort, a part plate, at least one spud site; and at least one manifold, wherein:
   the part plate is arranged within the retort,
   the retort and part plate define a portion of a chamber for supplying a vapor coating,
   a pipe is arranged to supply the vapor coating into the chamber,
   the part plate has at least one aperture to receive the at least one spud site,
   each of the at least one spud site includes a tube, wherein the tube of each spud site is fit into one aperture of the at least one aperture of the part plate,
   a first moldable sealant is arranged around the tube,
   each manifold includes at least one supply tube extending from the manifold to supply vapor into a respective hollow article,
   each manifold includes a feed tube extending from the manifold to supply vapor into the manifold,
   the tube of each of the at least one spud site is inserted into the feed tube of a respective manifold,
   an end of the feed tube remote from the manifold locates in the first moldable sealant around the tube of the respective spud site,
   a second moldable sealant is arranged around the at least one supply tube of the respective manifold and between the respective manifold and hollow article,
   a respective member extends from and is arranged around the tube of each spud site, the first moldable sealant being arranged on the respective member of the tube of each spud site, and
   the tube at each spud site locates in an aperture in the part plate and the respective member extending from the tube at each spud site abuts the part plate.

2. An arrangement as claimed in claim 1 wherein the member extending from the tube of the spud site is L-shape in cross-section.

3. An arrangement as claimed in claim 1 wherein the tube of the spud site is circular in cross-section.

4. An arrangement as claimed in claim 3 wherein the member extending from the tube of the spud site is arranged coaxially with the tube and the recess is annular.

5. An arrangement as claimed in claim 3 wherein the feed tube of the manifold is circular in cross-section.

6. An arrangement as claimed in claim 1 wherein the first moldable sealant and or the second moldable sealant is a moldable putty.

7. An arrangement as claimed in claim 6 wherein the moldable putty is a masking putty and comprises base metal powder which acts as a getter of vapor coating.

8. An arrangement as claimed in claim 7 wherein the base metal power comprises nickel powder and/or cobalt powder.

9. An arrangement as claimed in claim 1 wherein the first moldable sealant comprises a ring arranged around the tube.

10. An arrangement as claimed in claim 1 wherein the second moldable sealant comprises a ring arranged around the periphery of the manifold and the periphery of the hollow article.

11. An arrangement as claimed in claim 1 wherein each manifold has a plurality of tubes extending from the manifold to supply vapor into a respective hollow article, and the second moldable sealant is arranged around the plurality of supply tubes of the respective manifold.

12. An arrangement as claimed in claim 1 wherein each manifold has a plurality of tubes extending from the manifold to supply vapor into a respective hollow article, the second moldable sealant is arranged around the plurality of supply tubes of the respective manifold, and the second moldable sealant comprises a ring arranged around the periphery of the manifold and the periphery of the hollow article.

13. A method of vapor phase coating an internal surface of at least one hollow article comprising:
   providing a retort, a part plate, the part plate arranged within the retort, at least one spud site and at least one manifold, the retort and the part plate defining a portion of a chamber for supplying a vapor coating, and a pipe arranged to supply the vapor phase coating into the chamber, wherein:
   the part plate has at least one aperture to receive the at least one spud site,
   each of the at least one spud site has a tube, wherein the tube of each spud site is fit into one aperture of the at least one aperture of the part plate,
   a first moldable sealant being is arranged around the tube,
   each of the at least one manifold has at least one supply tube extending from the manifold,
   each of the at least one supply tube extends into a respective hollow article,
   each of the at least one manifold has a feed tube extending from the manifold,
   the tube of each spud site is inserted into the feed tube of a respective manifold,
   an end of the feed tube remote from the manifold locates in the first moldable sealant around the tube of the respective spud site,
   a second moldable sealant is arranged around the at least one supply tube of the respective manifold and between the respective manifold and hollow article,
   a respective member extends from and is arranged around the tube of each spud site, the first moldable sealant being arranged on the respective member of the tube of each spud site, and
   the tube at each spud site locates in an aperture in the part plate and the respective member extending from the tube at each spud site abuts the part plate,
   the method further comprising:
   supplying the vapor coating into the chamber and supplying the vapor coating from the chamber through the tube of the each spud site and through the feed tube into the respective manifold, and
   supplying the vapor coating from each manifold through the supply tube into the respective hollow article to coat the internal surfaces of each hollow article.

14. A method as claimed in claim 13 wherein the first moldable sealant and or the second moldable sealant is a moldable putty.

15. A method as claimed in claim 14 wherein the moldable putty is a masking putty and comprises base metal powder which acts as a getter of vapor coating.

16. A method as claimed in claim 15 wherein the base metal power comprises nickel powder and/or cobalt powder.

17. A method as claimed in claim 13 wherein the hollow article is a turbine blade or a turbine vane.

18. A method as claimed in claim 13 wherein the vapor phase coating comprises chromizing or aluminizing.

19. An arrangement for vapor phase coating an internal surface of at least one hollow article comprising:
   a retort, a part plate, at least one spud site and at least one manifold, wherein:
   the part plate is arranged within the retort, the part plate and the retort defining a portion of a chamber for supplying a vapor coating,
   the part plate has at least one aperture to receive the at least one spud site,
   a pipe is arranged to supply the vapor coating into the chamber,
   each spud site has a tube, the tube of each spud site being circular in cross-section,
   a first moldable sealant is arranged around the tube,
   each manifold has a plurality of supply tubes extending from the manifold to supply vapor into a respective hollow article, each manifold having a feed tube extending from the manifold to supply vapor into the manifold, the feed tube of each manifold being circular in cross-section,
   the tube of each spud site is inserted into the feed tube of a respective manifold,
   an end of the feed tube remote from the manifold locates in the first moldable sealant around the tube of the respective spud site, the first moldable sealant comprising a moldable putty, the first moldable sealant comprising a ring arranged around a tube, and
   a second moldable sealant is arranged around the plurality of supply tubes of the respective manifold and between the respective manifold and hollow article, the second moldable sealant comprising a moldable putty, and the second moldable sealant comprising a ring arranged around the periphery of the manifold and the periphery of the hollow article,
   wherein a respective member extends from and is arranged around the tube of each spud site to form a recess around each tube each recess containing the first moldable sealant, and
   wherein the tube at each spud site locates in an aperture in the part plate and wherein the respective member extending from the tube at each spud site abuts the part plate.

* * * * *